(12) United States Patent
Pauls et al.

(10) Patent No.: US 12,174,546 B2
(45) Date of Patent: Dec. 24, 2024

(54) METHOD FOR MEASURING AN EFFECT OF A WAVELENGTH-DEPENDENT MEASURING LIGHT REFLECTIVITY AND AN EFFECT OF A POLARIZATION OF MEASURING LIGHT ON A MEASURING LIGHT IMPINGEMENT ON A LITHOGRAPHY MASK

(71) Applicant: Carl Zeiss SMT GmbH, Oberkochen (DE)

(72) Inventors: Walter Pauls, Huettlingen (DE); Renzo Capelli, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 93 days.

(21) Appl. No.: 17/728,144

(22) Filed: Apr. 25, 2022

(65) Prior Publication Data

US 2022/0350258 A1    Nov. 3, 2022

(30) Foreign Application Priority Data

Apr. 27, 2021 (DE) .......................... 102021204170.1

(51) Int. Cl.
*G03F 7/00* (2006.01)
*G01N 21/21* (2006.01)
(Continued)

(52) U.S. Cl.
CPC ......... *G03F 7/70133* (2013.01); *G01N 21/21* (2013.01); *G01N 21/55* (2013.01); *G01N 21/956* (2013.01); *G01N 2021/95676* (2013.01)

(58) Field of Classification Search
CPC ......... G01N 2021/95676; G01N 21/21; G01N 21/55; G01N 21/956; G03F 1/24; G03F 1/84; G03F 7/70133
See application file for complete search history.

(56) References Cited

U.S. PATENT DOCUMENTS

| 2003/0081210 A1 | 5/2003 | Masaki et al. |
| 2004/0075830 A1 | 4/2004 | Miyake et al. |

(Continued)

FOREIGN PATENT DOCUMENTS

| CN | 112445083 | 3/2021 | |
| DE | 102009015393 | 9/2010 | ............. G01N 21/23 |

(Continued)

OTHER PUBLICATIONS

Office Action issued by the German Patent Office for Application No. DE 10 2021 204 170.1, dated Feb. 22, 2024 (with English Translation).

(Continued)

*Primary Examiner* — Hina F Ayub
(74) *Attorney, Agent, or Firm* — Fish & Richardson P.C.

(57) ABSTRACT

To measure an effect of a wavelength-dependent measuring light reflectivity $R_{Ref}$ of a lithography mask, a measuring light beam is caused to impinge on said lithography mask within a field of view of a measuring apparatus. The measuring light has a wavelength bandwidth between a wavelength lower limit and a wavelength upper limit differing therefrom. The reflected measuring light emanating from an impinged section of the lithography mask is captured by a detector. A filter with a wavelength-dependent transmission within the wavelength bandwidth is introduced into a beam path of the measuring light beam between the measuring light source and the detector. The measuring light reflected by the lithography mask is captured again by the detector once the filter has been introduced. The wavelength-dependent reflectivity $R_{Ref}$, or an effect of the wavelength-dependent reflectivity $R_{Ref}$ is determined on the basis of the capture results. In comparison with the prior art, this yields an improved method for measuring an effect of a measuring light reflectivity on a lithography mask. Addi- (Continued)

tionally, a method for measuring an effect of a polarization of measuring light on a measuring light impingement on a lithography mask is specified, wherein as a result of this the effect of the lithography mask on measuring light is made accessible in respect of further optical parameters of a measurement.

20 Claims, 6 Drawing Sheets

(51) Int. Cl.
  *G01N 21/55* (2014.01)
  *G01N 21/956* (2006.01)

(56) References Cited

U.S. PATENT DOCUMENTS

| | | | |
|---|---|---|---|
| 2012/0063666 A1 | 3/2012 | Arnz et al. | |
| 2012/0092669 A1 | 4/2012 | Fiolka et al. | |
| 2014/0307254 A1 | 10/2014 | Yamashita et al. | |
| 2014/0362360 A1* | 12/2014 | Saenger | G03F 7/70058 |
| | | | 359/849 |
| 2019/0250094 A1 | 8/2019 | Pandey et al. | |
| 2021/0063892 A1 | 3/2021 | Martin et al. | |

FOREIGN PATENT DOCUMENTS

| | | | |
|---|---|---|---|
| DE | 102010045135 | 3/2012 | ............ G03F 9/00 |
| DE | 102013207502 | 5/2014 | ............ G02B 27/28 |
| JP | 2003-133212 | 5/2003 | |
| JP | 2004-045267 | 2/2004 | |
| JP | 2007-537455 | 12/2007 | |
| JP | 2012-234883 | 11/2012 | |
| JP | 2014-209075 | 11/2014 | |
| WO | WO 2005/114148 | 12/2005 | |

OTHER PUBLICATIONS

Examination Report issued by the German Patent Office for Application No. DE 102021204170.1, dated Dec. 2, 2021 (with English Translation).

"Avogadro constant re-measured", PTB News Edition 03.1, published by Physikalisch-Technische-Bundesanstalt (National Metrology Institute of Germany) (Mar. 2003).

Horne et al., "Application of a high-brightness electrodeless Z-pinch EUV source for metrology, inspection, and resist development", *SPIE Proceedings of the 31$^{st}$ International Symposium of Microlithography*, (2006).

"X-Ray Interactions With Matter", *The Center for X-Ray Optics*, retrieved from the Internet: "http://henke.lbl.gov/optical_constants" (2010).

Office Action issued by the Japanese Patent Office for Application No. JP 2022-073194 by Examiner Hiromi Ito dated Aug. 24, 2023 (with English Translation).

Office Action issued by the Korean Patent Office for Application No. KR 10-2022-0051400 by Examiner Kyung-Gu Min, dated Jul. 18, 2024 (with English Translation).

* cited by examiner

METHOD FOR MEASURING AN EFFECT OF A WAVELENGTH-DEPENDENT MEASURING LIGHT REFLECTIVITY AND AN EFFECT OF A POLARIZATION OF MEASURING LIGHT ON A MEASURING LIGHT IMPINGEMENT ON A LITHOGRAPHY MASK

CROSS-REFERENCE TO RELATED APPLICATION

This application claims priority under 35 U.S.C. § 119 from German Application DE 10 2021 204 170.1, filed on Apr. 27, 2021, the entire content of which is incorporated herein by reference.

TECHNICAL FIELD

The invention relates to a method for measuring an effect of a wavelength-dependent measuring light reflectivity of a lithography mask. Furthermore, the invention relates to a method for measuring an effect of a polarization of measuring light on a measuring light impingement on a lithography mask. Moreover, the invention relates to a measuring apparatus for measuring an effect of a lithography mask on measuring light.

BACKGROUND

For measuring reflectivities of objects, reflectometers that illuminate an extended section of an object that is to be determined in terms of its reflectivity are known. Reflectometers are known in a variety of designs for various applications. A reflectometer for EUV (extreme ultraviolet) lithography is known from PTB News edition 1, 2003, published by the Physikalisch-Technische Bundesanstalt (National Metrology Institute of Germany).

DE 10 2009 015 393 B3 discloses a measuring method and a measuring system for measuring birefringence. DE 10 2010 045 135 A1 discloses a method for characterizing a structure on a mask, and an apparatus for carrying out the method.

SUMMARY

It is an aspect of the invention to make the effect of a lithography mask on measuring light accessible in respect of optical parameters of a measurement.

This aspect is achieved according to the invention by a measuring method having the features specified in Claim 1.

Such a measuring method allows the determination of, in particular, polarization components of a measuring light impingement on the measured lithography mask. It is also possible to determine polarization components of a measuring light impingement on components of the measuring apparatus, in particular on mirrors of the measuring apparatus.

The measurement of the effect of the polarization on the measuring light impingement on the lithography mask can be implemented in reflection and/or in transmission in relation to the lithography mask. The polarization filter can be introduced directly downstream of the measuring light source of the measuring apparatus, for example at the location of a debris filter, or can, alternatively or in addition, be introduced in the region of an intermediate focus of the measuring light upstream of the lithography mask.

In the case of a method according to Claim 2, the capture results using polarization filters that differ in terms of their polarization effect provide additional information that can be used when determining the effect. As an alternative to the use of a plurality of different polarization filters, it is also possible as a matter of principle to introduce one and the same polarization filter into the measuring light beam path, in each case with a different orientation. In particular, it is possible to change an angle of incidence of the measuring light on the polarization filter or else possible to change an orientation of a plane of incidence of the measuring light beam on the polarization filter.

In the method according to Claim 3, the structure resolution is compared without and with an introduced filter. The effect of the lithography mask on the polarization of the measuring light is measured by way of its effect on the structure resolution of the image representation. A critical dimension (CD) can be determined as a measure for the structure resolution. The structure resolution can be measured with the aid of a detector that measures in spatially resolved fashion, for example a CCD detector or a CMOS detector.

It is a further aspect of the present invention to improve a method for measuring an effect of a measuring light reflectivity of a lithography mask.

According to the invention, this aspect is achieved by a method for measuring an effect of a wvelength-dependent measuring light reflectivity $R_{Ret}$ on a lithography mask, including the following steps:

providing the lithography mask,
providing a reflectivity measuring apparatus,
  having a measuring light source for producing measuring light with a wavelength bandwidth between a wavelength lower limit and a wavelength upper limit differing therefrom,
  having a mask holder for holding the lithography mask,
  having a detector for capturing measuring light that was reflected by the lithography mask in the mask holder,
causing a measuring light beam to impinge on the lithography mask within a field of view of the measuring apparatus,
capturing the reflected measuring light emanating from an impinged section of the lithography mask using the detector,
introducing a filter with a wavelength-dependent transmission with the wavelength bandwidth into a beam path of the measuring light beam between the measuring light source and the detector,
capturing the reflected measuring light emanating from the impinged section of the lithography mask again using the detector once the filter has been introduced, and
determining the wavelength-dependent reflectivity $R_{Ret}$ or an effect of the wavelength-dependent reflectivity $R_{Ret}$ on the basis of the capture results.

According to the invention, it was recognized that it is possible to measure the effect of a wavelength-dependent measuring light reflectivity of a lithography mask with the aid of the introduction of a filter with a wavelength-dependent transmission within a wavelength bandwidth of the measuring light. To this end, EUV light, in particular, is used as measuring light, said EUV light also being used during the EUV projection exposure for producing microstructured or nanostructured semiconductor components. An example of a wavelength spectrum of a usable measuring light source is described in the specialist article "Application of a high-brightness electrodeless Z-pinch EUV source for metrology, inspection, and resist development," S. F. Horne et al., SPIE Proceedings of the 31st International Symposium on Microlithography, 2006. A wavelength bandwidth of the measuring light can be 1 nm and can be located around a central wavelength $\lambda_0$ of 13.5 nm between a wavelength lower limit of for example 13.0 nm and a wavelength upper limit of for example 14.0 nm. Depending on the measuring light source used, other wavelength bandwidths ranging between 0.2 nm and 100 nm and other central wavelengths ranging between 5 nm and 30 nm, and also longer wavelengths outside of the EUV wavelength range, for example in the VUV (vacuum ultraviolet) wavelength range, and even greater wavelength bandwidths are possible.

In principle, the method can also be used to measure the effect of a wavelength-dependent measuring light transmission of a lithography mask, that is to say to measure a phase mask for example.

It is possible to determine either the wavelength-dependent reflectivity or an effect of the wavelength-dependent reflectivity from the differences of the detection-capture results, which emerge without an introduced filter and with an introduced filter.

The respective filter can be introduced into a pupil plane of the measuring apparatus. The detector can be arranged in a field plane on which an object field arranged in the field of view is imaged. The filter can be introduced into the beam path of the measuring light beam between the measuring light source and the mask holder and/or into the beam path of the measuring light beam between the mask holder and the detector. In this way, it is possible to separate the wavelength influences of certain optical components of the measuring apparatus from the wavelength influence of the lithography mask itself. By way of example, it is also possible to measure the wavelength-dependent influence of a pellicle that might be used to protect the lithography mask.

As an alternative to measuring the effect of the wavelength-dependent measuring light reflectivity of a structured lithography mask, it is also possible to measure the effect of a wavelength-dependent measuring light reflectivity of a still unstructured mask blank. Alternatively or additionally in turn, the measuring method can also be used to measure the effect of a wavelength-dependent measuring light reflectivity of another component of the measuring apparatus, for example of one or more mirrors of the measuring apparatus.

The information obtained by the measuring method can be used to improve a method for producing microstructured or nanostructured components using EUV projection lithography.

In some examples, the steps of introducing a filter and capturing the reflected measuring light once the filter has been introduced are repeated for a plurality of filters which differ in terms of their wavelength-dependent transmission. The information content of the capture results is increased in the measuring method on account of the use of a plurality of filters that differ in terms of their wavelength-dependent transmission. Use can be made of at least one high-pass filter, at least one low-pass filter, at least one bandpass filter or else at least one notch filter. An inverse notch filter, which passes a target wavelength and blocks adjacent wavelengths, can also be used. Depending on the application, these various filter variants can also be used in combination. Instead of a sequential introduction of a plurality of different filters, one and the same filter can also be introduced multiple times, for example with different orientations, such that its wavelength-dependent transmission changes in each introduced position.

In some examples, the reflectivity measuring apparatus includes a projection optical unit for imaging an object field arranged in the field of view into an image field, a change in a structure resolution of the image representation as a result of the introduction of the filter being determined as effect. The advantages of the method correspond to those which were already explained above with reference to the Claim 3.

In some examples, the wavelength-dependent reflectivity $R_{Ret}$ is determined on the basis of the capture results in a wavelength range around a target wavelength ($\lambda_0$) within the wavelength bandwidth. A direct determination of the wavelength-dependent reflectivity accordingly yields comparable and, in particular, absolutely calibratable results, increasing the comparability thereof. Within the scope of determining the wavelength-dependent reflectivity, the reflectivity can be determined at a target wavelength and, moreover, a wavelength-dependent gradient of the reflectivity can be determined at said target wavelength. The reflectivity in the direct vicinity of the target wavelength can then be deduced by way of the determined gradient. Additionally, it is also possible to determine a wavelength-dependent curvature of the reflectivity at the target wavelength, which can help with yet again improving the accuracy of a determination of the reflectivity in the vicinity of the target wavelength. In principle, it is also possible to determine even higher derivatives of a functional relationship between reflectivity and wavelength. This can be implemented by capturing the reflected measuring light an appropriate number of times for different filter introduction situations with different wavelength-dependences of the transmission within the wavelength bandwidth. Depending on the number of captures, it is possible to determine a corresponding number of mutually independent wavelength-dependent effect quantities.

Lithography masks regularly do not have isotropic structuring but often have structure sections with for example a preferred structure direction, for example vertical or horizontal structures, or have structure sections with certain structure symmetries. This is considered in the measuring method in which an influence of structures on the lithography mask on the wavelength-dependent reflectivity $R_{Ret}$ is determined when determining the wavelength-dependent reflectivity $R_{Ret}$.

When determining the reflectivity or the polarization effect, it is possible to determine an effect on the basis of structures on the lithography mask, analogous to what was explained in the context of the measuring method in which an influence of structures on the lithography mask on the wavelength-dependent reflectivity $R_{Ret}$ is determined when determining the wavelength-dependent reflectivity $R_{Ret}$.

In some examples, the filter has a non-rotationally symmetric filter effect in a filter arrangement plane and is introduced into the beam path of the measuring light beam with a defined orientation relative to an axis of rotation perpendicular to the filter arrangement plane. In the measuring method, further measurement information arises on account of the non-rotationally symmetric filter effect of the filter and said information can be used for the effect measurement. A deviation of the filter effect from the rotational symmetry can be adapted to match a symmetry of structures on the lithography mask to be measured. Such a filter with a non-rotationally symmetric filter effect can be introduced, in particular, into a pupil plane of the measuring apparatus such that, for example, this results in an illumination of the lithography mask with different measuring light wavelength distributions from different illumination directions.

The filter with the non-rotationally symmetric filter effect can be introduced into the measuring light beam multiple times with different orientations in certain applications of the measuring method, measuring light being captured in each case following the introduction of the filter in the respective orientation. This also yields additional measurement information which allows conclusions to be drawn about the effect of the wavelength-dependent measuring light reflectivity of the lithography mask and optionally also about the effect of a wavelength-dependent measuring light reflectivity of components of the measuring apparatus, in particular of mirrors of the measuring apparatus.

The two measuring methods, firstly for measuring an effect of a wavelength-dependent measuring light reflectivity of a lithography mask and secondly for measuring an effect of a polarization of measuring light on a measuring light impingement on a lithography mask, can also be used in combination with one another. Firstly, the wavelength-dependent reflectivity information and, secondly, the polarization information obtained in this way can complement one another in respect of the information in relation to the lithography mask.

The two measuring methods can be carried out with the aid of an interchange filter which brings about an attenuation of the measuring light, either in wavelength-dependent fashion or in polarization-dependent fashion.

In some examples, a measuring apparatus for measuring an effect of a lithography mask on measuring light includes:
   a measuring light source for producing a measuring light,
   a mask holder for holding the lithography mask such that a section of the lithography mask is arranged within a field of view on which the measuring light can impinge,
   a detector for capturing the measuring light that is reflected by the lithography mask in the mask holder,
   at least one filter holder with at leat one filter, arranged in a beam path of the measuring light beam between the measuring light source and the detector,
   wherein the filter holder is designed as an interchangeable filter holder, and
   a signal acquisition and evaluation device that is signal connected to the detector. The advantages of the measuring apparatus correspond to those which were already explained above with reference to the measuring methods. In particular, the measuring apparatus can be used to carry out the above-described measuring methods.

The measuring light of the measuring apparatus can have a wavelength bandwidth between a wavelength lower limit and a wavelength upper limit differing therefrom. At least one filter that can be used with the measuring apparatus can have a wavelength-dependent transmission within the wavelength bandwidth.

The at least one filter holder can be designed such that a plurality of filters can be inserted into the filter holder.

The filter holder can be configured as an interchange filter holder, for example as a filter carousel or a filter wheel. The filter can be configured as a high-pass filter, as a low-pass filter, as a bandpass filter, as a notch filter, as an inverse notch filter and/or as a polarization filter. The interchange filter holder can be configured to interchange the respective filter currently arranged in the beam path of the measuring light beam between the measuring light source and the detector with at least one interchange filter. The interchange filter holder can comprise a drive for changing filters. The interchange filter holder can be operatively connected to a filter cartridge, from which a filter to be respectively inserted into the beam path of the measuring light beam is selected. This selection can be implemented by use of the signal acquisition and evaluation device of the measuring apparatus. To this end, the signal acquisition and evaluation device can be signal connected to the interchange filter holder.

The measuring apparatus can comprise a plurality of filter holders which are arranged at different locations within the measuring light beam path. In a manner analogous to the measurement of a wavelength-dependent reflectivity, the measuring apparatus can also be used for measuring a wavelength-dependent transmission of the lithography mask. The at least one filter of the measuring apparatus can have a non-rotationally symmetric filter effect in a filter plane. The at least one filter of the measuring apparatus can have different filter sections with different filter effects in the filter plane. In particular, these filter effects can differ in terms of their wavelength dependence and/or in terms of their polarization dependence.

In some examples, the filter holder is arranged in a pupil plane of the measuring apparatus. The filter holder facilitates the generation of an illumination angle-sensitive measuring light influence by inserting the filter into the filter holder. This can be used to measure illumination angle-dependent lithography mask effects.

In some examples, the filter holder is arranged in the beam path of the measuring light beam between the measuring light source and the mask holder and/or in the beam path of the measuring light beam between the mask holder and the detector. Arrangement variants of the filter holder have proven their worth in practice. The filter holder can be arranged upstream of a first mirror of an illumination optical unit of the measuring apparatus disposed downstream of the measuring light source. Alternatively or in addition, the filter holder can be arranged in the vicinity of an intermediate focus between the measuring light source and the field of view, that is to say the impingement region on the lithography mask. If the filter is arranged in the vicinity of the intermediate focus, use can be made of a focal stop with a plurality of apertures, with each of the apertures being equipped with a filter and each filter preferably having a different filter effect.

In some examples, the measuring apparatus includes a projection optical unit for imaging an object field arranged in the field of view into an image plane, with the detector being arranged in the image plane. The arrangement of the detector allows field of view-specific effects of the lithography mask on the measuring light to be determined if a spatially resolving detector is used. Alternatively or in addition, the detector can be designed such that the latter facilitates a pupil measurement, in particular a field-dependent pupil measurement. This renders it possible to determine the effect of the lithography mask on an illumination angle distribution, in particular in respect of, firstly, a wavelength-dependent reflectivity and/or in respect of, secondly, a polarization-optical effect.

In some examples, the filter holder is oriented such that a filter arrangement plane is tilted in relation to a normal plane to the measuring light beam path. The filter holder allows the use of a tilt-dependent filter effect, in particular the use of polarization-optical filter tilt effects, in particular the Brewster effect. The filter holder can be designed such that the tilt angle can be adjustably specified.

The filter holder can be designed such that a filter orientation with respect to the measuring light beam path can be specified when the measuring light impinges on the filter.

In some examples, the filter has a plurality of filter sections that are tilted in relation to a normal plane (xy) to a beam direction (z) of the measuring light. Should the filter be arranged with a tilt in relation to the measuring light beam path, an embodiment of the filter can lead to a compact arrangement of the filter. The filter sections of the filter can be arranged in mutually parallel and spaced apart planes.

BRIEF DESCRIPTION OF DRAWINGS

Exemplary embodiments of the invention are explained in more detail below with reference to the drawings, in which.

DETAILED DESCRIPTION

Figure 1:
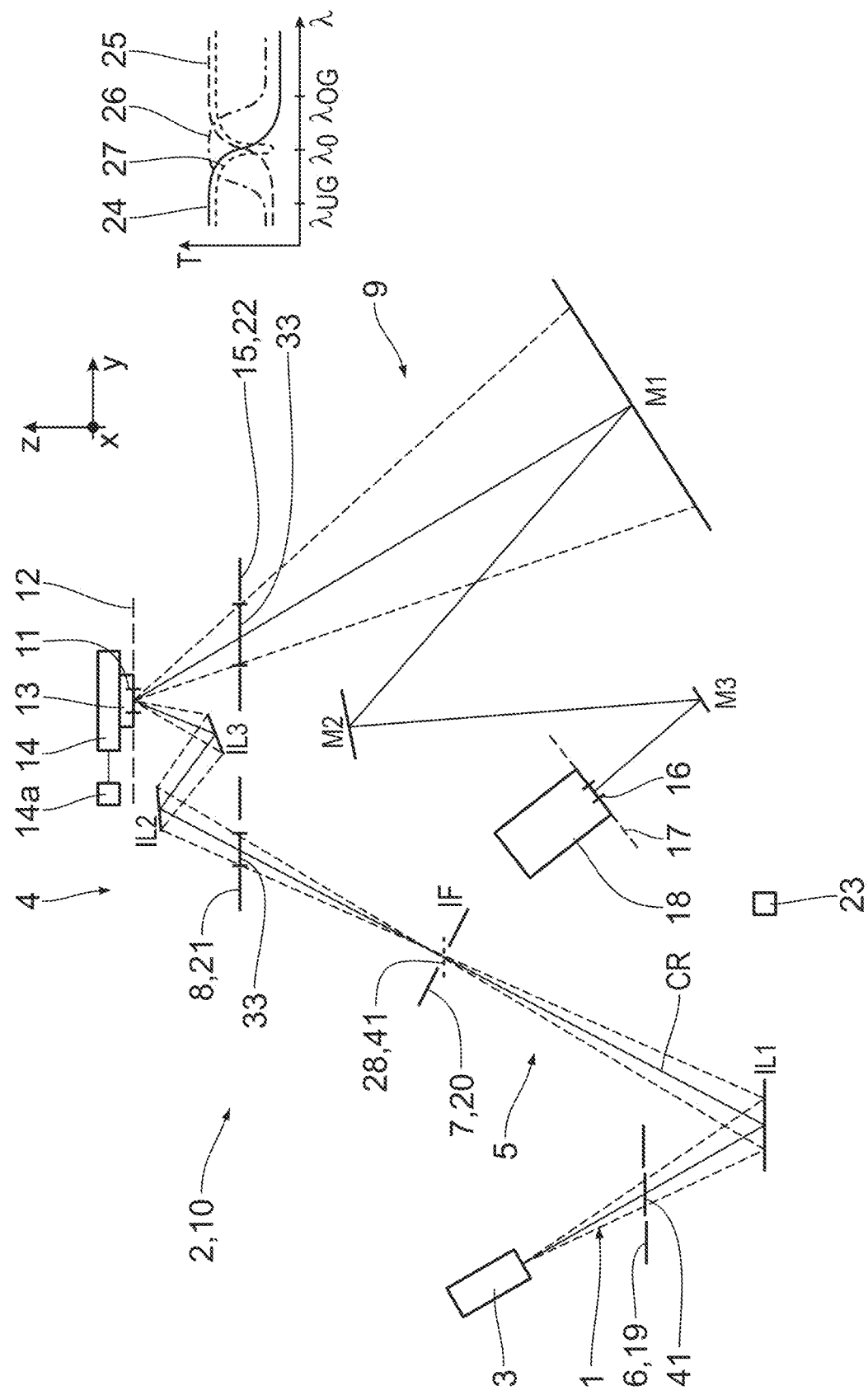
FIG. 1 schematically shows a measuring apparatus for measuring an effect of a lithography mask on measuring light, comprising an illumination system, an imaging optical unit and a spatially resolving detection device.

FIG. 1 shows, in a sectional view corresponding to a meridional section, a beam path of EUV illumination light or EUV imaging light 1 in a metrology system 2, which is embodied in the form of a reflectivity and polarization measuring apparatus. The illumination light 1 is produced by an EUV light source 3. The illumination light 1 is also referred to as measuring light.

In order to facilitate the representation of positional relationships, a Cartesian xyz-coordinate system is used hereinafter. The x-axis in FIG. 1 extends perpendicular to the plane of the drawing and out of the latter. The y-axis in FIG. 1 extends toward the right. The z-axis in FIG. 1 extends upwardly. A local Cartesian xy- or xyz-coordinate system is also used in the subsequent figures. In this local coordinate system, the x-axis in each case extends parallel to the x-axis of the global coordinate system according to FIG. 1. With the x-axis of the local coordinate system, the y-axis spans an optical surface of the respectively depicted optical component. Accordingly, the y- and z-axes of the local coordinate systems are optionally tilted in relation to the y- and z-axes of the global coordinate system according to FIG. 1.

The light source 3 can be a laser plasma source (LPP; laser produced plasma) or a discharge source (DPP; discharge produced plasma). In principle, a synchrotron-based light source can also be used, for example a free electron laser (FEL). A used wavelength of the illumination light 1 can lie in the range of between 5 nm and 30 nm. In principle, in the case of a variant of the metrology system 2, it is also possible to use a light source for another used light wavelength, for example for a used wavelength of 193 nm. The measuring light 1 of the light source 3 can be collected by a collector. In this case, the collector can be an ellipsoidal collector or a nested collector, for example.

FIG. 1 shows a beam path of the measuring light 1 by way of a chief ray CR, drawn as a solid line, of a central field point and by way of two marginal rays, shown in dashes. Said marginal rays in each case delimit a pupil in a pupil plane of the metrology system 2.

The illumination light 1 is conditioned in a schematically illustrated illumination optical unit 4 of an illumination system 5 of the metrology system 2, of which the light source 3 is also a part, in a manner such that a specific illumination setting of the illumination is provided, that is to say a specific illumination angle distribution. A specific intensity distribution of the illumination light 1 in a pupil of the metrology system 2 corresponds to said illumination setting. In this case, it is possible to specify for example a multi-pole illumination setting, in particular a quadrupole illumination setting. Other illumination settings can also be specified within the metrology system 2, for example a conventional illumination setting in which practically all illumination angles are used for object illumination, in particular with the exception of illumination angles close to perpendicular or average incidence on the object to be illuminated, an annular illumination setting with small illumination angles overall, that is to say illumination angles close to perpendicular or average incidence, which itself can in turn be omitted, or dipole illumination settings, wherein the individual poles can each have a "leaflet" contour in a pupil plane, that is to say an edge contour that corresponds approximately to the section through a biconvex lens element.

The illumination optical unit 4 has a total of three EUV mirrors, denoted in FIG. 1 in the order of impingement thereof by IL1, IL2 and IL3. A filter plane 6 is located between the light source 3 and the first mirror IL1 of the illumination optical unit 4, in which filter plane for example a debris filter can be arranged that protects optical components downstream in the beam path of the measuring light 1 against radiation components and/or particle components that come from the light source 3 and are undesirably guided along.

An intermediate focal plane 7 of the illumination system 5 is located between the mirrors IL1 and IL2. An intermediate focus IF of the measuring light 1 is arranged here. A pinhole stop that can have a function corresponding to that of the debris filter can be arranged in the intermediate focal plane 7.

A pupil plane 8 of the illumination optical unit 4 is located between the intermediate focal plane 7 and the mirror 112 of the illumination optical unit 4. A setting stop for specifying the illumination setting can be arranged in said pupil plane 8.

Together with an imaging optical unit or projection optical unit 9, the illumination system 5 constitutes an optical measuring system 10 of the metrology system 2. The projection optical unit 9 has a total of three EUV mirrors, denoted in FIG. 1 in the order of impingement thereof by M1, M2 and M3.

With the illumination setting that is respectively set, the illumination light 1 illuminates an object field or field of view 11 of an object plane 12 of the metrology system 2. A lithography mask 13 is arranged in the object plane 12. As an alternative to such a structured object, an unstructured object can also be measured, for example a mask blank.

The object plane 12 extends parallel to the xy-plane. The object field 11 simultaneously constitutes a field of view of the projection optical unit 9 or of the metrology system 2.

The lithography mask or the object 13 is carried by an object holder 14 which is depicted schematically in FIG. 1 and which is also referred to as a mask holder. The object 13 can be displaced in the object plane 12 in at least two translational degrees of freedom with the aid of an object displacement drive 14a, which cooperates with the object holder 14. A further degree of freedom of displacement provided by the object displacement drive 14a lies perpendicular to the object plane 12, that is to say along the z-direction.

The illumination light 1 is reflected by the lithography mask 13, as depicted schematically in FIG. 1, and enters an entrance pupil of the imaging optical unit 9 in a pupil plane 15. The pupil plane 15 is indicated schematically within the projection optical unit 8 in FIG. 1. The pupil used of the imaging optical unit 9 can have a circular or elliptic boundary.

The imaging optical unit 9 images the object field 11 in an operating situation of the metrology system 2 into an image field or measurement field 16 in an image plane or measurement plane 17 of the metrology system 2. A magnifying imaging scale during the imaging by the projection optical unit 9 is greater than 500. Depending on the embodiment of the projection optical unit 9, the magnifying imaging scale can be greater than 100, can be greater than 200, can be greater than 250, can be greater than 300, can be greater than 400 and can also be significantly greater than 500. The imaging scale of the projection optical unit 9 is regularly less than 2000.

The projection optical unit 9 serves for imaging a section of the object 13, which section is arranged in the object field 11, into the image plane 17.

A spatially resolving detection device or a detector 18 of the metrology system 2 is arranged in the image plane or measurement plane 17. This detection device can be a CCD (charge-coupled device) camera. Accordingly, the image field 16 will also be referred to as measurement field hereinafter. The detection device 18, which is also referred to as a detector, serves for capturing measuring light 1 reflected by the object 13.

The field of view 11 has an extent in the xy-plane that is smaller than 50 µm×50 µm, for example 10 µm×10 µm.

The detector 18 can have for example in the measurement field 16 a resolution of 1000×1000 pixels.

A spatial resolution of the detector 18 within the field of view 11 can be better than 100 nm and be for example in the range between 1 nm and 10 nm.

Depending on the embodiment, the detector 18 can be used firstly to implement a spatially resolved capture of the measuring light 1 over the measuring field 16 and secondly also implement an illumination angle-resolved capture such that an illumination angle distribution of the measuring light 1 at a field point can also be determined for each field point with the aid of the detector 18.

The measuring apparatus or the metrology system 2 serves to measure an effect of a wavelength-dependent measuring light reflectivity on the lithography mask 13. Alternatively or in addition, the measuring apparatus 2 serves to measure an effect of a polarization of the measuring light 1 on a measuring light impingement of the lithography mask 13. A wavelength-dependent reflectivity or a polarization effect of a component of the measuring apparatus 2 can also be measured therewith.

The measuring apparatus 2 provides various filter holders for the purposes of fulfilling these measurement tasks, specifically a filter holder 19 at the location of the filter plane 6 also used by the debris filter, a filter holder 20 at the location of the intermediate focal plane 7, a filter holder 21 at the location of the illumination optical unit pupil plane 8 and a filter holder 22 at the location of the projection optical unit pupil plane 15.

These filter holders 19 to 22 are all arranged in the beam path of the measuring light beam 1 between the measuring light source 3 and the detector 18.

A signal acquisition and evaluation device 23 of the metrology system 2 is signal connected to the detector 18 (not shown here). The signal acquisition and evaluation device 23 can additionally be signal connected to further components of the measuring apparatus 2, for example to drives (not shown here in more detail) of the filter holders 19, 20, 21, 22, in particular for the driven filter displacement and/or filter changes. In addition, the signal acquisition and evaluation device 23 can be signal connected to the object displacement drive 14a for the purposes of controlling the latter.

The measuring light 1 has a wavelength bandwidth between a wavelength lower limit and a wavelength upper limit differing therefrom. An example of such a wavelength bandwidth is specified in the specialist article "Application of a high-brightness electrodeless Z-pinch EUV source for metrology, inspection, and resist development," S. F. Horne et al., SPIE Proceedings of the 31st International Symposium on Microlithography, 2006. By way of example, the wavelength lower limit $\lambda_{UG}$ can be at 13.0 nm and the wavelength upper limit $\lambda_{OG}$ can be at 14.0 nm. A central wavelength $\lambda_0$ of the measuring light 1 can be at 13.5 nm.

One of the filters that can be inserted into one of the filter holders 19 to 22 of the metrology system 2 can be a filter with a wavelength-dependent transmission within this wavelength bandwidth.

One of the filters can be embodied as a low-pass filter with a transmission function 24 that is depicted in an insert in FIG. 1 as a solid line. For relatively short wavelengths shorter than $\lambda_0$, the transmission function 24 is such that a high transmission T is present there. The transmission T of the low-pass filter 24 is low for wavelengths longer than the central wavelength A. A corresponding transmission function of a high-pass filter 25 is plotted in the insert of FIG. 1 using a dashed line and a transmission function of a bandpass filter 26 is plotted using a dash-dotted line. In the case of the high-pass filter 25, wavelengths longer than $\lambda_0$ are transmitted on account of a correspondingly high transmission of the high-pass filter 25 and wavelengths shorter than $\lambda_0$ are absorbed to a greater extent. In the case of the bandpass filter 26, wavelengths around the central wavelength $\lambda_0$ are transmitted, and wavelengths below a respective wavelength band around $\lambda_0$ and above a wavelength band blocked in each case A transmission function 27 of a notch filter is also depicted in the insert of FIG. 1 using a dotted line, said notch filter acting like an inverse bandpass filter with a very small bandwidth, that is to say it blocks a very tight wavelength range around the central wavelength $\lambda_0$. A further variant of a filter that is usable in the metrology system or the measuring apparatus 2 is an inverted notch filter which transmits the measuring light 1 in a tight wavelength range around the central wavelength $\lambda_0$ and otherwise blocks said measuring light.

As indicated in the case of the filter holder 20 in the intermediate focal plane 7 by way of a dashed line, the filter holder 20 can be oriented in such a way that a filter arrangement plane 28 (cf. FIG. 1) is tilted in relation to a normal plane to the measuring light beam path 1, which coincides with the intermediate focal plane 7.

There will be further details regarding the filters that can be arranged in the filter holders 19 to 22 in the further course of the description.

Figure 2:
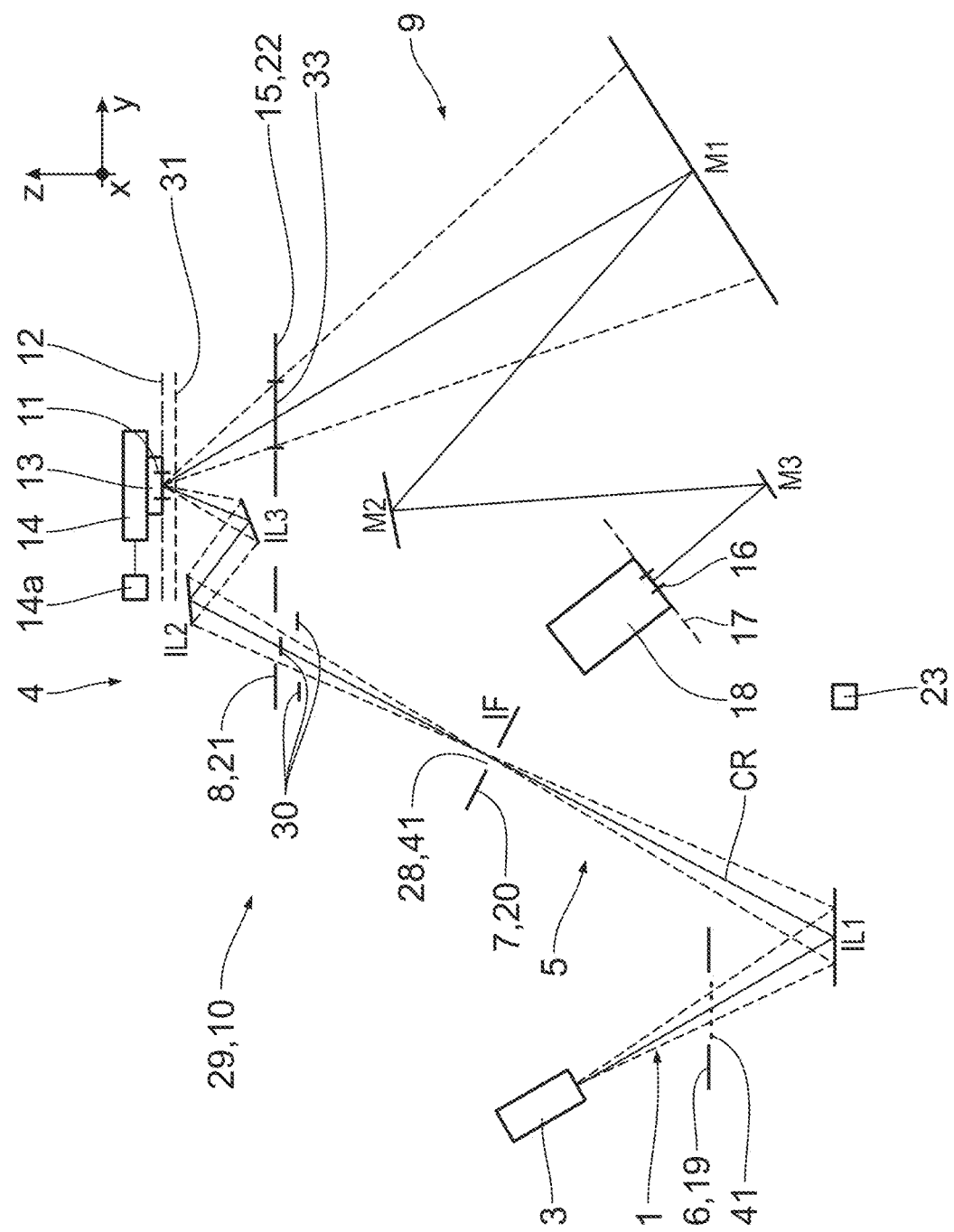
FIG. 2 shows, in an illustration similar to FIG. 1, a further embodiment of the measuring apparatus.

FIG. 2 shows a further embodiment of the measuring apparatus 29, which can be used instead of the one according to FIG. 1. Components and functions corresponding to those which have already been explained above with reference to FIG. 1 bear the same reference signs and will not be discussed in detail again.

In the case of the measuring apparatus 29, there are a plurality of energy sensors 30, for example three energy sensors 30, in the region of the illumination optical unit pupil plane 8, said energy sensors for example capturing marginal individual rays of the measuring light beam 1 in the region of the illumination optical unit pupil plane 8. In this way, it is possible to obtain normalization data by means of which variations of measuring light quantities between the measuring light source 3 and the illumination optical unit pupil plane 8 can be separated from the effects on the measuring light 1 of subsequent components in the measuring light beam path. Moreover, a quality of a setting of an illumination setting can also be monitored by way of the energy sensors 30.

Moreover, a pellicle 31, that is to say a protective film for the lithography mask 13, is indicated in FIG. 2 at a distance from the lithography mask 13 and spaced apart from the object plane 12 in the negative z-direction. Otherwise, the structure of the measuring apparatus 29 corresponds to that of the measuring apparatus 2.

A further embodiment of a measuring light beam path in a further embodiment of a measuring apparatus 32 is described below on the basis of FIG. 3. Functions and components corresponding to those which have already been explained above with reference to FIGS. 1 and 2 bear the same reference signs and will not be discussed in detail again.

Figure 3:
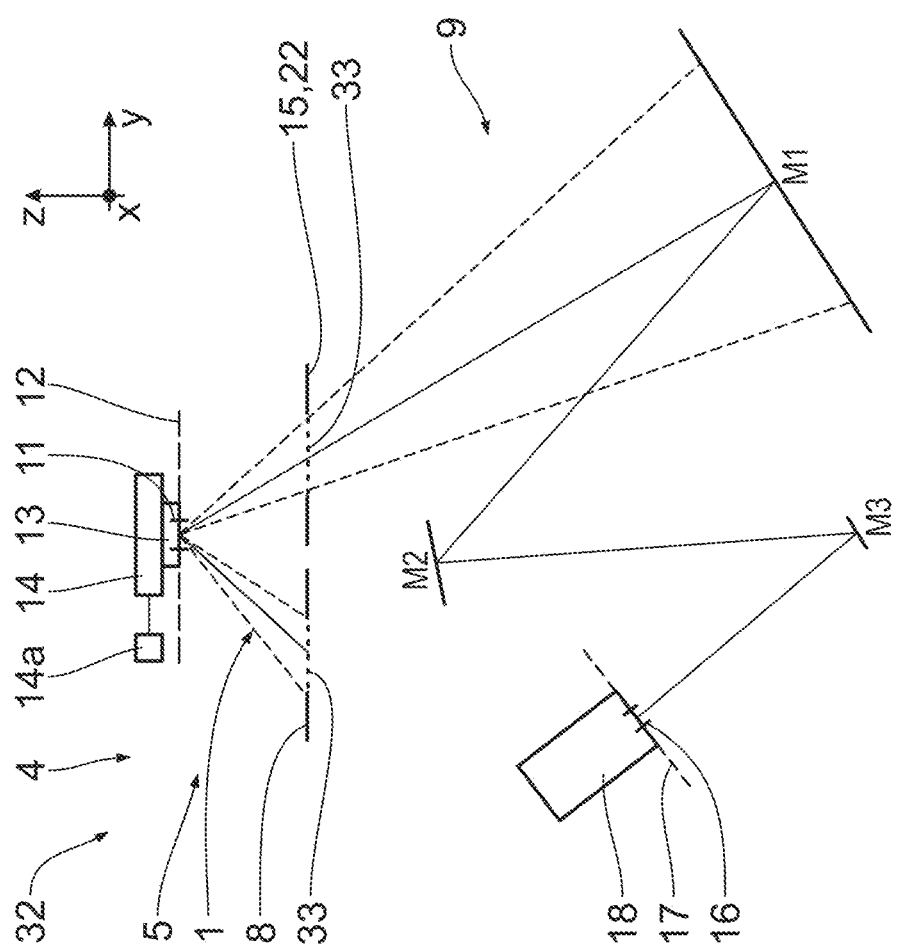
FIG. 3 shows a further embodiment of the measuring apparatus in a representation which exhibits a measuring light beam path between an illumination-side pupil plane and the detection device.

The measuring apparatus 32 is depicted in FIG. 3 for the measuring light beam path between the illumination optical unit pupil plane 8 and the detector 18. The illumination system 5 of the measuring apparatus 32 has no optical components that influence the measuring light beam 1 between the illumination optical unit pupil plane 8 and the object field 11. Thus, the illumination optical unit mirrors IL2 and 113 are lacking in the measuring apparatus 32 in comparison with the measuring apparatuses 2 and 29. Otherwise, the measuring apparatus 32 corresponds to the measuring apparatuses 2 and 29.

Figure 4:
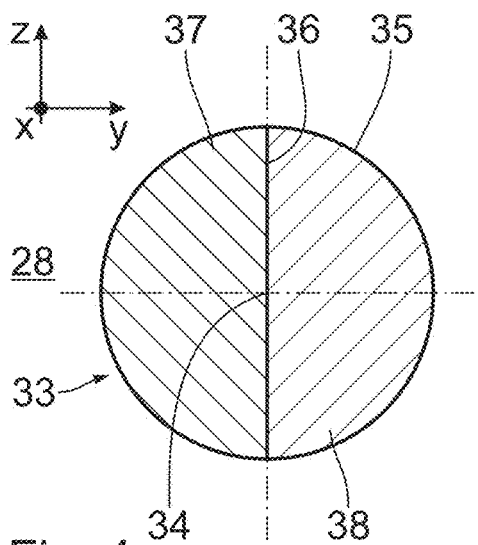
FIG. 4 shows a plan view of a filter for measuring a wavelength-dependent measuring light reflectivity of a lithography mask as a constituent part of the measuring apparatus.
Figure 5:
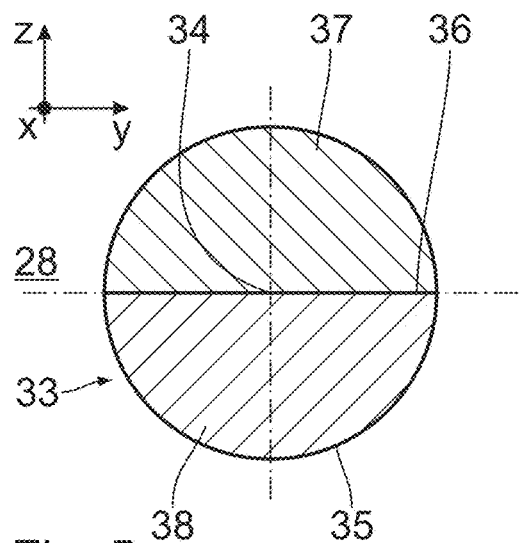
FIG. 5 shows the filter according to FIG. 4 with an orientation rotated 90° clockwise in comparison with FIG. 4.

An example of a filter with a wavelength-dependent transmission function is described below on the basis of FIGS. 4 and 5. FIGS. 4 and 5 show the wavelength filter 33 in two different orientations, in each case in a plan view, the orientation according to FIG. 5 being rotated 90° clockwise in relation to that of FIG. 4 around a central filter axis 34, which is perpendicular to the plane of the drawing of FIGS. 4 and 5.

The wavelength filter 33 has a circular edge 35 and is divided in two halves in terms of its transmission function, said halves being separated from one another by way of a separation line 36 that is perpendicular in FIG. 4. One half of the wavelength filter 33, to the left in FIG. 4, is embodied as a high-pass filter section 37 with the transmission function 25. The measuring light 1 that radiates through the high-pass filter section 37 is suppressed at short wavelengths that are shorter than the central wavelength $\lambda_0$.

The half of the wavelength filter 33 to the right in FIG. 4 is embodied as a low-pass filter section 38, which has a transmission function corresponding to the transmission function 24 in the insert of FIG. 1. In the low-pass filter section 38, the wavelengths of the measuring light 1 that are shorter than the central wavelength $\lambda_0$ are transmitted and the wavelengths longer than the central wavelength $\lambda_0$ are suppressed.

By way of example, when carrying out a method for measuring an effect of a wavelength-dependent measuring light reflectivity of the lithography mask 13, the wavelength filter 33 is used as follows:

First, the lithography mask 13 and the measuring apparatus 2, 29 or 32 are provided, the latter then operating as a reflectivity measuring apparatus. Then, the measuring light beam 1 is caused to impinge on the lithography mask 13 within the field of view 11. In this case, no further filter is arranged in the filter holders 19 to 22 of the measuring apparatus 2, 29 or 32 with the exception of the debris filter in the filter plane 6. Then, the reflected measuring light 1 emanating from the section of the lithography mask 13 impinged by the measuring light beam 1 is captured by the detector 18.

Subsequently, the wavelength filter 33 is introduced into the filter holder 21 in the illumination optical unit pupil plane 8 or alternatively into the filter holder 22 in the projection optical unit pupil plane 15, for example with the orientation depicted in FIG. 4. The rotational orientation of the wavelength filter 33 in the filter holder 21 or 22 around the filter axis 34 can be adapted to an orientation of structures on the lithography mask 13.

Following introduction of the wavelength filter 33, the reflected measuring light emanating from the impinged section of the lithography mask 13 is captured again by the detector 18. Then, either the wavelength-dependent reflectivity of the lithography mask around the central wavelength $\lambda_0$ is determined directly or an effect of the wavelength-dependent reflectivity around the central wavelength $\lambda_0$ is determined on the basis of the two capture results of "without filter/with an introduced filter."

The effect of the wavelength-dependent reflectivity can be a change in a structure resolution of the image representation of structures of the lithography mask 13 as a result of the introduction of the filter 33. By way of example, a critical dimension (CD) could be determined firstly on the basis of measuring light 1 captured without an introduced filter 33 and secondly on the basis of measuring light 1 captured with an introduced wavelength filter 33.

Instead of the subdivided wavelength filter 33, it is also possible to introduce a wavelength filter which has a transmission function, for example in the style of the transmission functions 24 to 27 explained above, over its entire surface.

In particular, whether a minimal achievable CD changes on account of the introduction of the wavelength filter can be determined in this way. In this way, it is possible to deduce a wavelength-dependent reflectivity of the lithography mask 13 around the central wavelength $\lambda_0$.

The following formalism can be used to directly determine the wavelength-dependent reflectivity around the target wavelength $\lambda_0$ on the basis of the capture results "without filter/without filter."

Using pupil coordinates ($k_x$, $k_y$) in the respective pupil plane, an intensity $S_\sigma(\lambda)$ of the measuring light 1 passing through a pupil plane of the measuring apparatus 2, 29, 32 can be written as:

$$S_\sigma(\lambda) = \int_\Sigma P_\sigma(k_x, k_y) I(k_x, k_y, \lambda) dk_x dk_y$$

$P_\sigma$ is a pupil function which reproduces where measuring light 1 is present in the utilized pupil of the respective pupil plane 8 or 5. In the case of a conventional illumination setting, $P_\sigma$ is for example one for all pupil coordinates $k_x$, $k_y$ within the pupil of the measuring apparatus 2, 29 or 32 and zero everywhere else. In principle, the values of the pupil function $P_Q$ can also adopt "greyscale" values of between zero and one.

$I(k_x, k_y, \lambda)$ is the luminous intensity of the measuring light 1 from one pupil coordinate, that is to say from exactly one illumination direction, for the wavelength X.

A luminous intensity $S_{ES}$ detected by the energy sensors 30 can be written as:

$$S_{ES} = \int_{\lambda_{min}}^{\lambda_{max}} \int_{ES} P_\sigma(k_x, k_y) I(k_x, k_y, \lambda) dk_x dk_y d\lambda$$

The energy sensors 30 integrate over all wavelengths.

A luminous intensity $S_{CCD}(x,y)$ detected by a CCD detector of the detection device 18 with spatial resolution in the x- and y-coordinates of the measuring field 16 can, as a function of $S_\sigma(\lambda)$, be written as $$S_{CCD}(x, y) = \int_{\lambda_{min}}^{\lambda_{max}} S_\sigma(\lambda) T_{IL2}(\lambda) T_{IL3}(\lambda) \qquad (1)$$

$$R_{Ret}(x, y, \theta, \lambda) T_{NA}(\lambda) T_{M1}(\lambda) T_{M2}(\lambda) T_{M3}(\lambda) A_{CCD}(\lambda) d\lambda$$

In this case:

$T_{IL2}(\lambda)$, $T_{IL3}(\lambda)$ are the wavelength-dependent reflectivities of the mirrors IL2 and IL3 of the illumination optical unit 4. A wavelength-dependent reflectivity of the mirror IL1 can also be considered accordingly.

$R_{Ret}(x, y, \theta, \lambda)$ is the reflectivity of the lithography mask 13 as a function of the field location x, y depending on the illumination angle $\theta$ of the measuring light 1 at the object plane 12 of the respective location of the field of view 11.

$T_{NA}$ is the wavelength-dependent transmission of the filter, in particular of the filter 33, in the pupil plane 8 or 15, that is to say for example one of the transmission functions 24 to 27 of the insert of FIG. 1, where $T_{NA}$ can also depend on the pupil coordinates should a subdivided wavelength filter 33 be used, for example in the style of the wavelength filter 33 according to FIG. 4.

$T_{M1}(\lambda)$, $T_{M2}(\lambda)$, $T_{M3}(\lambda)$ are the wavelength-dependent reflectivities of the three mirrors M1, M2 and M3 of the projection optical unit 9.

$A_{CCD}(\lambda)$ is a wavelength-dependent absorption coefficient or a wavelength-dependent sensitivity of the CCD sensor of the detector 18.

Below, the assumption is made that, firstly, the reflectivity of the lithography mask 13 around the central wavelength $\lambda_0$ and, secondly, the transmission function of the filter 33 around the central wavelength $\lambda_0$ do not change abruptly. Then, as conventional in perturbation theory, both $R_{Ret}(x, y, \theta, \lambda)$ and $T_{NA}(\lambda)$ can be written as an expansion according to powers of a deviation of the wavelength A from the central wavelength $\lambda_0$.

A product $T_{NA}(\lambda)R_{Ret}(x, y, \theta, \lambda)$ can now be inserted into Formula (1) above, with additionally a normalized intensity $t(x,y) = S_{CCD}(x,y)/S_{ES}$ also being taken into account. This yields:

$$t(x, y) = T_{NA}(\lambda_0) R_{Ret}(x, y, \lambda_0) \Sigma^{(0)} + \qquad (2)$$

$$\left( \frac{d}{d\lambda} T_{NA}(\lambda_0) R_{Ret}(x, y, \lambda_0) + T_{NA}(\lambda_0) \frac{d}{d\lambda} R_{Ret}(x, y, \lambda_0) \right) \Sigma^{(1)} +$$

$$\frac{1}{2} \left( \frac{d^2}{d\lambda^2} T_{NA}(\lambda_0) R_{Ret}(x, y, \lambda_0) + \right.$$

$$\left. 2\frac{d}{d\lambda} T_{NA}(\lambda_0) R_{Ret}(x, y, \lambda_0) + T_{NA}(\lambda_0) \frac{d^2}{d\lambda^2} R_{Ret}(x, y, \lambda_0) \right) \Sigma^{(2)}$$

Here, the terms $\Sigma^{(0)}$, $\Sigma^{(1)}$ and $\Sigma^{(2)}$ represent $$\Sigma^{(0)} = \int_{\lambda_{min}}^{\lambda_{max}} \frac{S_\sigma(\lambda)}{S_{ES}} T_{IL2}(\lambda) T_{IL3}(\lambda) T_{M1}(\lambda) T_{M2}(\lambda) T_{M3}(\lambda) A_{CCD}(\lambda) d\lambda$$

(0th order)

$$\Sigma^{(1)} = \int_{\lambda_{min}}^{\lambda_{max}} (\lambda - \lambda_0) \frac{S_\sigma(\lambda)}{S_{ES}} T_{IL2}(\lambda) T_{IL3}(\lambda) T_{M1}(\lambda) T_{M2}(\lambda) T_{M3}(\lambda) A_{CCD}(\lambda) d\lambda$$

(1st order)

$$\Sigma^{(2)} = \int_{\lambda_{min}}^{\lambda_{max}} (\lambda - \lambda_0)^2 \frac{S_\sigma(\lambda)}{S_{ES}} T_{IL2}(\lambda) T_{IL3}(\lambda) T_{M1}(\lambda) T_{M2}(\lambda) T_{M3}(\lambda) A_{CCD}(\lambda) d\lambda$$

(2nd order)

To a first approximation, the quantities $\Sigma^{(0)}$, $\Sigma^{(1)}$ and $\Sigma^{(2)}$ do not depend on intensity fluctuations of the light source 3.

To determine the following quantities of interest:

$R_{RET}(x, y, \lambda_0)$, i.e., the reflectivity of the lithography mask 13 at the central wavelength $\lambda_0$, $$\frac{d}{d\lambda} R_{Ret}(x, y, \lambda_0),$$

i.e., the first derivative of the reflectivity of the lithography mask 13 at the target wavelength $\lambda_0$ and $$\frac{d^2}{d\lambda^2} R_{Ret}(x, y, \lambda_0),$$

i.e., the curvature of the wavelength-dependent reflectivity at the central wavelength $\lambda_0$ two transmission functions $T^{(1)}_{NA}(\lambda_0)$ $T^2_{NA}(\lambda_0)$ are required first, said transmission functions differing firstly in the form of the transmission function around the central wavelength $\lambda_0$ and also in terms of their first and second derivatives $$\frac{d}{d\lambda}T_{NA}^{(1/2)}(\lambda_0)$$

and $$\frac{d^2}{d\lambda^2}T_{NA}^{(1/2)}(\lambda_0).$$

A third transmission function $T^{(3)}_{NA}$ arises trivially by a measurement without a wavelength field, and so the following applies $T^{(3)}_{NA}(\lambda_0)=1$ and has values for the first derivative and the curvature of 0 in each case.

The following system of equations arises for the three measurements with the first filter function $T^{(1)}_{NA}$ with the first wavelength filter, for example a filter with the transmission function 24 according to FIG. 1, with the second filter with the filter function $T^{(2)}_{NA}$, for example with the transmission function 25 according to FIG. 1, and without a filter with the transmission function $T^{(3)}_{NA}$:

$$I_1(x, y) = T_{NA}^{(1)}(\lambda_0)R_{Ref}(x, y, \lambda_0)\Sigma^{(0)} + \tag{3}$$

$$\left(\frac{d}{d\lambda}T_{NA}^{(1)}(\lambda_0)R_{Ref}(x, y, \lambda_0) + T_{NA}^{(1)}(\lambda_0)\frac{d}{d\lambda}R_{Ref}(x, y, \lambda_0)\right)\Sigma^{(1)} +$$

$$\frac{1}{2}\left(\frac{d^2}{d\lambda^2}T_{NA}^{(1)}(\lambda_0)R_{Ref}(x, y, \lambda_0) + 2\frac{d}{d\lambda}T_{NA}^{(1)}(\lambda_0)R_{Ref}(x, y, \lambda_0) + \right.$$

$$\left. T_{NA}^{(1)}(\lambda_0)\frac{d^2}{d\lambda^2}R_{Ref}(x, y, \lambda_0)\right)\Sigma^{(2)}$$

$$I_2(x, y) = T_{NA}^{(2)}(\lambda_0)R_{Ref}(x, y, \lambda_0)\Sigma^{(0)} + \tag{4}$$

$$\left(\frac{d}{d\lambda}T_{NA}^{(2)}(\lambda_0)R_{Ref}(x, y, \lambda_0) + T_{NA}^{(2)}(\lambda_0)\frac{d}{d\lambda}R_{Ref}(x, y, \lambda_0)\right)\Sigma^{(1)} +$$

$$\frac{1}{2}\left(\frac{d^2}{d\lambda^2}T_{NA}^{(2)}(\lambda_0)R_{Ref}(x, y, \lambda_0) + 2\frac{d}{d\lambda}T_{NA}^{(2)}(\lambda_0)R_{Ref}(x, y, \lambda_0) + \right.$$

$$\left. T_{NA}^{(2)}(\lambda_0)\frac{d^2}{d\lambda^2}R_{Ref}(x, y, \lambda_0)\right)\Sigma^{(2)}$$

$$I_3(x, y) = \tag{5}$$

$$R_{Ref}(x, y, \lambda_0)\Sigma^{(0)}\left(\frac{d}{d\lambda}R_{Ref}(x, y, \lambda_0)\Sigma^{(1)} + \frac{1}{2}\frac{d^2}{d\lambda^2}R_{Ref}(x, y, \lambda_0)\Sigma^{(2)}\right)$$

Then, the desired values for $$R_{Ref}(x, y, \lambda_0), \frac{d}{d\lambda}R_{Ref}(x, y, \lambda_0) \text{ and } \frac{d^2}{d\lambda^2}R_{Ref}(x, y, \lambda_0)$$

can be determined from this linear system of equations. To the extent that use is made of wavelength filters in the style of the wavelength filter 33 according to FIG. 4 with transmission function that varies over the filter surface, these values for the reflectivities, the gradients thereof and the curvatures thereof at the central wavelength $\lambda_0$ can still be determined as a function of the illumination angle. In this way, structure influences, in particular, can also be acquired.

Within the scope of carrying out the measuring method, the wavelength filter 33 according to FIG. 4 can be introduced into the respective filter holder, for example into the filter holders 21 and 22, in a plurality of orientations.

FIG. 5 shows such a further orientation, in the case of which the wavelength filter 33 is oriented rotated clockwise through 90° about the drawing axis 34 in comparison with the orientation according to FIG. 4. Accordingly, the separation line 36 is horizontal in the case of the orientation of the wavelength filter 33 according to FIG. 5, the high-pass filter section 37 is located at the top and the low-pass filter section 38 is located at the bottom.

Figure 6:
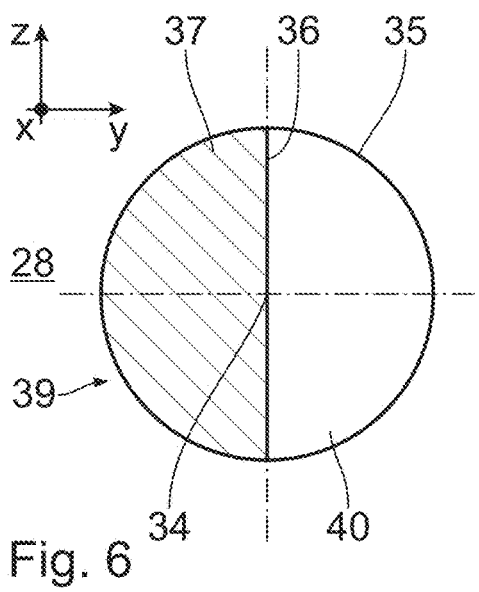
FIG. 6 shows, in an illustration similar to FIG. 4, a further embodiment of a filter for measuring a wavelength-dependent reflectivity.
Figure 7:
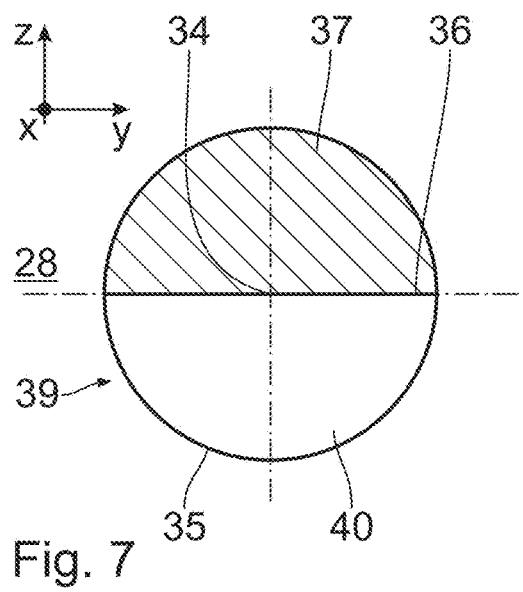
FIG. 7 shows, in an illustration similar to FIG. 5, the filter according to FIG. 6.

FIGS. 6 and 7 show a further wavelength filter 39, which can be used as an alternative or in addition to the wavelength filter 33 when carrying out the measuring method. Instead of the low-pass filter section 38, the wavelength filter 39 has a fully transmissive filter section 40, for which the following applies: T=1. The wavelength filter 39 also has the high-pass filter section 37 like the wavelength filter 33.

FIG. 6 shows the wavelength filter 39 in an orientation with a perpendicular separation line 36, corresponding to the orientation of the wavelength filter 33 according to FIG. 4.

Similar to FIG. 5, FIG. 7 shows the wavelength filter 39 rotated 90° clockwise.

Figure 8:
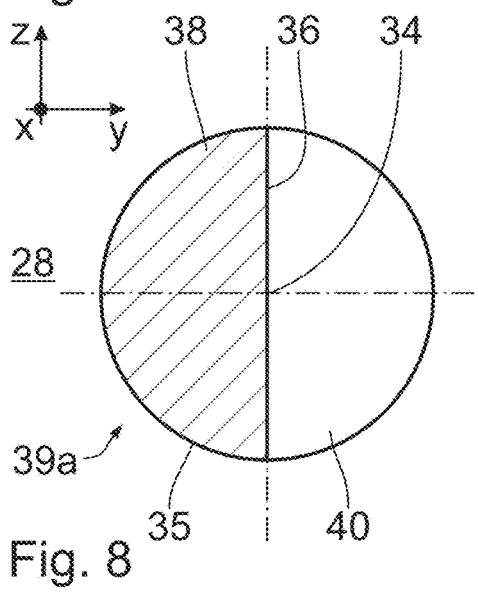
FIG. 8 shows, in an illustration similar to FIG. 4, a further embodiment of a filter for measuring a wavelength-dependent reflectivity.
Figure 9:
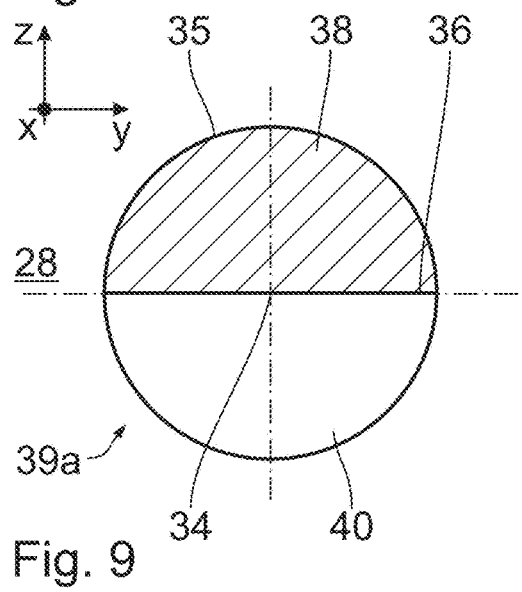
FIG. 9 shows, in an illustration similar to FIG. 5, the filter according to FIG. 8.

FIGS. 8 and 9 show a further embodiment of a wavelength filter 39a, which can be used as an alternative or in addition to the wavelength filters 33 and 39 or to the other filters, already explained above, with the transmission functions according to FIG. 1.

The structure of the wavelength filter 39a corresponds to that of the wavelength filter 39 according to FIGS. 6 and 7. Instead of the high-pass filter section 37, the wavelength filter 39a has a low-pass filter section 38 which corresponds to that already explained above in relation to the wavelength filter 33.

FIGS. 8 and 9 show the wavelength filter 39a in two orientations, which correspond to those of the wavelength filter 39 in FIGS. 6 and 7.

Figure 10:
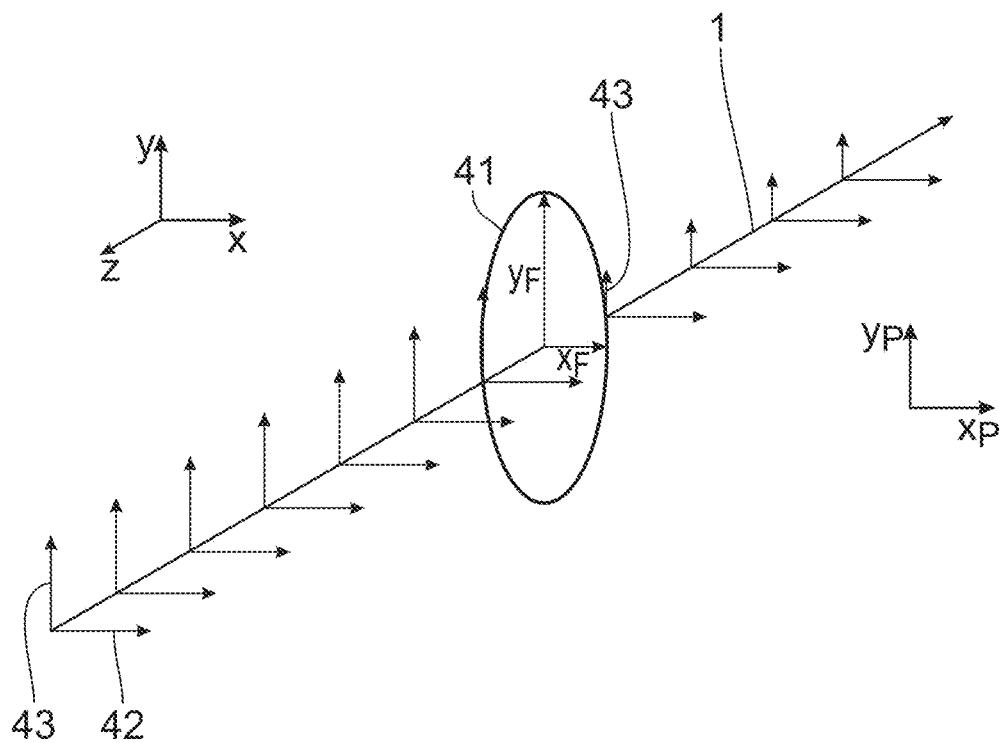
FIG. 10 shows an effect of a polarization filter as a constituent part of an embodiment of the measuring apparatus on incident measuring light in a perspective illustration.

FIG. 10 shows a polarization filter 41 and its effect on a polarization state of a measuring light beam 1 passing through the polarization filter 41.

The polarization filter 41 can be used in a method for measuring an effect of a polarization of the measuring light 1 on a measuring light impingement on the lithography mask 13 using the measuring apparatus 2, 29 or 32, as an alternative or in addition to the above-described method for measuring the effect of the wavelength-dependent measuring light reflectivity on the lithography mask 13.

The polarization filter 41 is arranged tilted about an axis parallel to the $y_P$-axis in relation to the plane of the drawing of FIG. 10, which is spanned by polarization coordinates $x_P$, $y_P$. The coordinates $x_F$, $y_F$ which span a filter arrangement plane 28 of the polarization filter 41 are likewise plotted in FIG. 10. The $y_F$-coordinate extends parallel to the $y_P$-coordinate. The $x_F$-coordinate extends at an angle to the $x_y$-coordinate. This angle corresponds to a tilt angle of the filter arrangement plane $x_F y_F$ in relation to a normal plane xy to the measuring light beam path 1, which in turn extends parallel to the polarization plane $x_P y_P$.

A tilt angle of the filter arrangement plane $x_F y_F$ with respect to the polarization plane $x_P y_P$ is such that the Brewster condition is satisfied for an x-polarization component 42 of the measuring light 1. Consequently, the x-polarization component 42 is not attenuated during the passage through the polarization filter 41. The x-polarization component 42 is the p-polarization component in relation to a plane of incidence of the measuring light 1 on the filter arrangement plane $x_F y_F$. This plane of incidence is parallel to the xz-plane of the polarization coordinates of the measuring light beam 1.

A y-polarization component 43 of the measuring light 1 is attenuated during the passage through the polarization filter 41 since this y-polarization component 43 represents an s-polarization component in relation to the plane of incidence xz.

Thus, the polarization filter 41 changes the polarization state of the measuring light 1. Following the passage through the polarization filter 41, the measuring light 1 is present in a filter polarization state that differs from a raw polarization state of the measuring light 1 prior to impingement on the polarization filter 41.

Should the x/y-polarization components 42, 43 have been present with an intensity ratio of for example 1/1 prior to entry in the polarization filter 41, this ratio has changed following the passage through the polarization filter 41 to a ratio of ½ or 0.5/1.

To measure the effect of the polarization of the measuring light 1 on a measuring light impingement on the lithography mask 13, the lithography mask 13 and the measuring apparatuses of one of the embodiments of the measuring apparatuses 2, 29 or 32 are once again initially provided. The measuring light source 3 produces the measuring light 1 in the raw polarization state. Following a first round of causing the measuring light beam 1 to impinge on the lithography mask 13 within the field of view 11 of the measuring apparatus 2 and of capturing the measuring light 1 emanating from the impinged section of the lithography mask 13 with the detector 13 and with a still unutilized polarization filter, the polarization filter 41 is subsequently inserted into one of the filter holders of the measuring apparatus 2, 29 or 32, for example into the filter holder 19 and/or into the filter holder 20.

Subsequently, the measuring light 1 emanating from the impinged section of the lithography mask 13 is captured again using the detector 18 once the polarization filter 41 has been introduced.

The effect of the polarization of the measuring light 1 on the measuring light impingement of the lithography mask 13 is then determined on the basis of the results of the two capture steps "without/with polarization filter."

This polarization effect can be determined for the two polarization directions $x_P$, $y_P$ with the aid of the formalism that was explained above in conjunction with the determination of the reflectivity at the wavelength $\lambda_0$. To this end, the steps of "introducing the polarization filter" and "capturing the measuring light once the polarization filter has been introduced" are repeated for a plurality of polarization filters which differ in terms of their polarization effect on the measuring light 1. Alternatively or in addition, it is also possible for one and the same polarization filter 41 to be introduced into the beam path of the measuring light 1 with different orientations. Such orientations, which differ from the orientation according to FIG. 10, can differ in terms of the tilt angle about the y-axis and/or in terms of the orientation of the filter arrangement plane $x_F y_F$ relative to the coordinates xyz of the measuring light beam 1. Thus, for example, the polarization filter 41 can also be oriented in such a way that the Brewster condition is satisfied for the y-polarization component 43.

In a manner analogous to determining the change in structure resolution on the basis of the reflectivity of the lithography mask 13, as described above in the context of the reflectivity measuring method, the polarization measuring method can be used to determine, as an effect, a change of a structure resolution of the image representation of the structures on the lithography mask 13 by the introduction of the respective polarization filter 41. To this end, the CD can be determined in turn. This change in the structure resolution can be determined depending on, in particular, an orientation of structures on the lithography mask 13.

Figure 11:
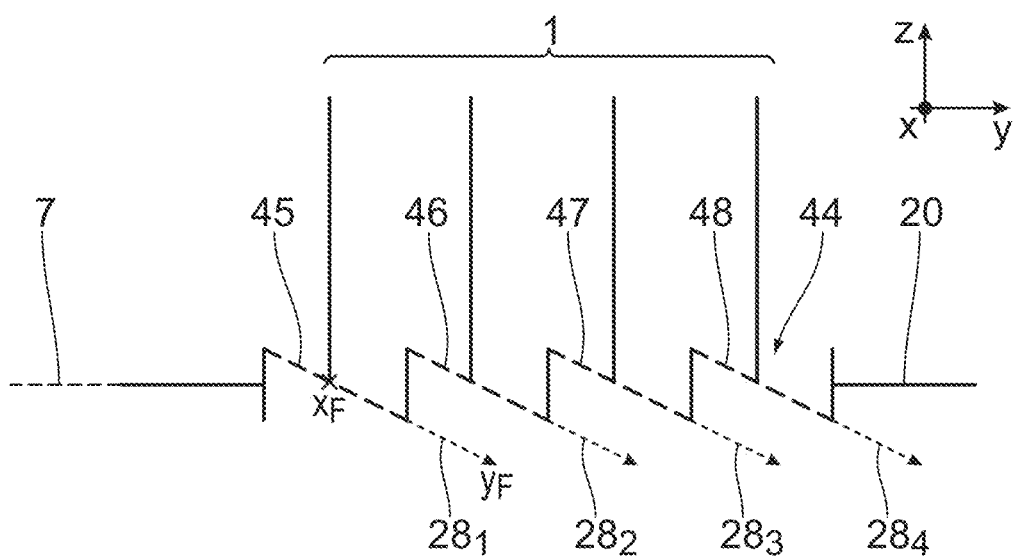
FIG. 11 in turn shows a meridional section of a further embodiment of a polarization filter with a plurality of filter sections that are tilted in relation to a normal plane to a measuring light beam path.

FIG. 11 shows a further embodiment of a polarization filter 44, which can be used instead of the polarization filter 41. The polarization filter 44 is depicted held in a filter holder, which could be one of the filter holders 19 and 20, for example. FIG. 11 shows the filter holder 20 in the intermediate focal plane 7 in exemplary fashion. A plane of the drawing of FIG. 11 is perpendicular to this intermediate focal plane 7.

The polarization filter 44 has a plurality of filter sections, a total of four filter sections 45, 46, 47, 48 in the depicted embodiment, the filter arrangement planes $28_1$, $28_2$, $28_3$ and $28_4$ of said filter sections being located parallel to one another and each being tilted in relation to a normal plane xy to the beam path of the measuring light 1, which strikes the polarization filter 44 from the top in FIG. 11, that is to say in the negative z-direction. Despite the tilt of the filter arrangement planes $28_i$ $(=x_F y_F)$ in relation to the normal planes xy located parallel to the intermediate focal plane 7, an advantageously small installation space of the projection filter 44 arises in the measuring light beam direction, that is to say in the z-direction of FIG. 11, on account of the subdivision of the polarization filter 44 into the filter sections 45 to 48.

Figure 12:
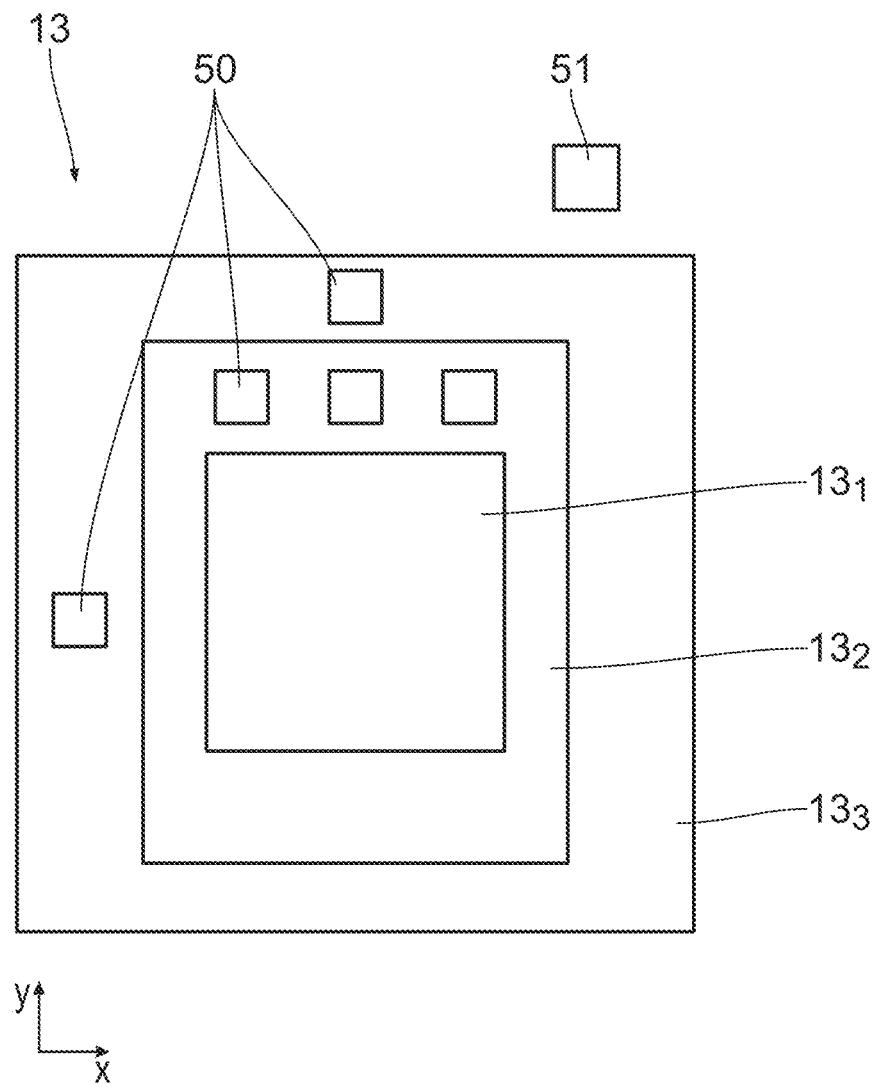
FIG. 12 shows a plan view of a lithography mask to be measured by the measuring apparatus.

FIG. 12 shows by way of example an embodiment of a lithography mask 13 that is to be measured. The latter is divided into a central zone $13_1$, in which a structuring is provided that is imaged onto a wafer to be structured during the use of the lithography mask 13 during the projection exposure. This central zone $13_1$ is approximately square.

The central zone $13_1$ is surrounded by a transition zone $13_2$ with a maximum reflectivity for the illumination light 1 that is reduced compared to the central zone $13_1$. Reflection sections 50 can be arranged at the location of the transition zone $13_2$ for determining a signal strength of the measuring light 1 impinging on the object 13. In addition to the measuring light beam 1 impinging on the field of view 11, the illumination system 5 can be designed such that at least one of the reflection sections 50 on the object 13 is impinged upon with the aid of at least one further measuring light beam. Then, the respective further measuring light beam is directed by the reflection sections 50 to at least one energy sensor 51 corresponding to the above-described energy sensors 30 for determining the measuring light signal strength Such energy sensors 51, which are depicted schematically in FIG. 12, can be arranged on a spatially fixed component of the measuring apparatus 2, which is not displaced when the object 13 is displaced.

The transition zone $13_2$ is designed to extend around an outer periphery of the central zone $13_1$. The transition zone $13_2$ in turn is surrounded by a peripheral zone 133 of the object 13. The latter serves for cooperating with the object holder 14 and is generally designed to be non-reflective, but can likewise carry reflection sections 50, as indicated in FIG. 12.

A maximum reflection of the central zone $13_1$ can lie in the range between 60% and 70% of the incident measuring light 1. A maximum reflection of the transition zone $13_2$ can lie in the range between 55% and 65% of the incident measuring light 1.

The above-described filters can be realized as thin films. In particular, these filters can be constructed as a multilayer system. The influence of such multilayer systems on a wavelength-dependent transmission and/or on a polarization of transmitted measuring light can be calculated with the aid of algorithms described in the technical literature. Refractive indices of appropriate materials which are used in the construction of such a multilayer system are tabulated and, for example, available from the Internet site http://henke.lbl.gov/optical_constants/.

The polarization filter 41 can attenuate a certain polarization component of the incident measuring light in relation to another polarization component, for example s-polarized measuring light in relation to p-polarized measuring light. Such a polarization filter can be designed by specifying and optimizing the multilayer system. An angle of incidence of the measuring light on the polarization filter 41 can be specified and/or optimized together with the multilayer design.

The multilayer system of the filter can be chosen to be periodic or aperiodic.

A reflectivity and a transmission for the two polarization components (s-polarized component, p-polarized component or tangential polarization component and sagittal polarization component) of the polarization filter 41 can be calculated with the aid of a transfer matrix formalism, as known from the technical literature.

While this specification contains many implementation details, these should not be construed as limitations on the scope of the invention or of what can be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are described in a particular order, this should not be understood as requiring that such operations be performed in the particular order, or that all operations be performed, to achieve desirable results. Moreover, the separation of various system components in the embodiments described above should not be understood as requiring such separation in all embodiments.

Thus, particular embodiments of the invention have been described. Other embodiments are within the scope of the following claims. In addition, the actions recited in the claims can be performed in a different order and still achieve desirable results.

What is claimed is:

1. A method for measuring an effect of a polarization of measuring light on a measuring light impingement on a lithography mask, including the following steps:
    providing the lithography mask,
    providing a polarization measuring apparatus,
        having a measuring light source for producing measuring light with a raw polarization state,
        having a mask holder for holding the lithography mask,
        having a detector for capturing the measuring light in a measuring light beam path downstream of the mask holder,
    causing a measuring light beam to impinge on the lithography mask within a field of view of the measuring apparatus,
    capturing the measuring light emanating from an impinged section of the lithography mask using the detector,
    introducing a polarization filter with a polarization-dependent effect on the measuring light into the beam path of the measuring light beam between the measuring light source and the detector for the purposes of producing measuring light with a filter polarization state that differs from the raw polarization state,
    the polarization filter having such a polarization-dependent effect on the measuring light that said polarization filter attenuates a certain polarization component of the incident measuring light in relation to another polarization component of the incident measuring light,
    capturing the measuring light emanating from the impinged section of the lithography mask again using the detector once the polarization filter has been introduced,
    determining the effect of the polarization of the measuring light on the measuring light impingement on the lithography mask on the basis of the capture results.

2. The method of claim 1, wherein the steps of introducing the filter and capturing the measuring light once the polarization filter has been introduced are repeated for a plurality of polarization filters which differ in terms of their polarization effect on the measuring light.

3. The method of claim 1, wherein the polarization measuring apparatus comprises a projection optical unit for imaging an object field arranged in the field of view into an image field, a change in a structure resolution of the image representation as a result of the introduction of the polarization filter being determined as effect.

4. The method of claim 2, wherein the polarization measuring apparatus comprises a projection optical unit for imaging an object field arranged in the field of view into an image field, a change in a structure resolution of the image representation as a result of the introduction of the polarization filter being determined as effect.

5. The method of claim 4, wherein a critical dimension is determined as a measure for the structure resolution.

6. The method of claim 4, wherein the structure resolution is measured with the aid of a detector that measures in spatially resolved fashion.

7. The method of claim 6, wherein the detector is a CCD detector.

8. The method of claim 6, wherein the detector is a CMOS detector.

9. The method of claim 1, wherein polarization components of an impingement of the measurement light on the lithography mask are determined.

10. The method of claim 1, wherein polarization components of an impingement of the measurement light on components of the measuring apparatus are determined.

11. The method of claim 1, wherein the effect of the polarization of the measuring light impingement on the lithography mask is implemented in reflection in relation to the lithography mask.

12. The method of claim 1, wherein the effect of the polarization of the measuring light impingement on the lithography mask is implemented in transmission in relation to the lithography mask.

13. The method of claim 1, wherein the polarization filter is introduced directly downstream of the measuring light source.

14. The method of claim 1, wherein the polarization filter is introduced at a location of a debris filter.

15. The method of claim 1, wherein the polarization filter is introduced in the region of an intermediate focus of the measuring light upstream of the lithography mask.

16. The method of claim 1, wherein repeated steps of introducing the filter and capturing the measuring light once the polarization filter has been introduced are done with one and the same polarization filter, in each case with a different orientation.

17. The method of claim 1, wherein an angle of incidence of the measuring light on the polarization filter is changed between the repeated steps.

18. The method of claim 1, wherein an orientation of a plane of incidence of the measuring light on the polarization filter is changed between the repeated steps.

19. The method of claim 1, further comprising measuring an effect of a wavelength-dependent measuring light reflectivity RRet on the lithography mask, including the following steps:
- providing the lithography mask,
- providing a reflectivity measuring apparatus,
  - having a measuring light source for producing measuring light with a wavelength bandwidth between a wavelength lower limit and a wavelength upper limit differing therefrom,
  - having a mask holder for holding the lithography mask,
  - having a detector for capturing measuring light that was reflected by the lithography mask in the mask holder,
- causing a measuring light beam to impinge on the lithography mask within a field of view of the measuring apparatus,
- capturing the reflected measuring light emanating from an impinged section of the lithography mask using the detector,
- introducing a filter with a wavelength-dependent transmission within the wavelength bandwidth into a beam path of the measuring light beam between the measuring light source and the detector,
- capturing the reflected measuring light emanating from the impinged section of the lithography mask again using the detector once the filter has been introduced,
- determining the wavelength-dependent reflectivity RRet or an effect of the wavelength-dependent reflectivity RRet on the basis of the capture results.

20. A measuring apparatus for measuring an effect of a lithography mask on measuring light and configured to perform the method of claim 1, the measuring apparatus comprising:
- a measuring light source for producing a measuring light,
- a mask holder for holding the lithography mask such that a section of the lithography mask is arranged within a field of view on which the measuring light can impinge,
- a detector for capturing the measuring light that is reflected by the lithography mask in the mask holder,
- at least one filter holder with at least one filter, arranged in a beam path of the measuring light beam between the measuring light source and the detector,
- wherein the filter holder is designed as an interchangeable filter holder, and
- a signal acquisition and evaluation device that is signal connected to the detector.

* * * * *

UNITED STATES PATENT AND TRADEMARK OFFICE
CERTIFICATE OF CORRECTION

Page 1 of 2

PATENT NO. : 12,174,546 B2
APPLICATION NO. : 17/728144
DATED : December 24, 2024
INVENTOR(S) : Walter Pauls and Renzo Capelli It is certified that error appears in the above-identified patent and that said Letters Patent is hereby corrected as shown below:

On the Title Page

Column 2
Item (57) (Abstract), Line 15, delete "$R_{Ret}$," and insert -- $R_{Ret}$ --

In the Specification

Column 2
Line 25, delete "wvelength" and insert -- wavelength --
Line 44, delete "with" and insert -- within --

Column 5
Line 31, delete "with at leat" and insert -- with at least --

Column 8
Line 41, delete "IL1." and insert -- IL1, --
Line 56, delete "112" and insert -- IL2 --

Column 10
Line 35 (Approx.), delete "$\lambda_{UG}$;" and insert -- $\lambda_{UG}$ --
Line 49, delete "wavelength A" and insert -- wavelength $\lambda_0$ --

Column 11
Line 53, delete "113" and insert -- IL3 --

Column 13
Line 17, delete "$P_Q$" and insert -- $P_\sigma$ --
Line 21, delete "wavelength X" and insert -- wavelength $\lambda$ --

Signed and Sealed this
Fourth Day of March, 2025

Coke Morgan Stewart
*Acting Director of the United States Patent and Trademark Office*

CERTIFICATE OF CORRECTION (continued)
U.S. Pat. No. 12,174,546 B2

Column 14
Line 5, delete "wavelength A" and insert -- wavelength λ --

Lines 20-22, delete "$2\frac{d}{d\lambda}T_{NA}(\lambda_0)R_{Ret}(x, y, \lambda_0) + T_{NA}(\lambda_0)\frac{d^2}{d\lambda^2}R_{Ret}(x, y, \lambda_0)\bigg)\Sigma^{(2)}$" and insert -- $2\frac{d}{d\lambda}T_{NA}(\lambda_0)\frac{d}{d\lambda}R_{Ret}(x, y, \lambda_0) + T_{NA}(\lambda_0)\frac{d^2}{d\lambda^2}R_{Ret}(x, y, \lambda_0)\bigg)\Sigma^{(2)}$ --

Line 47 (Approx.), delete "R_{RET}(x, y, λ₀)" and insert -- $R_{Ret}(x, y, \lambda_0)$, --
Line 64, delete "$T^2_{NA}(\lambda_0)$" and insert -- $T^{(2)}_{NA}(\lambda_0)$ --

Column 15

Lines 24-26, delete "$\bigg(\frac{d}{d\lambda}T^{(1)}_{NA}(\lambda_0)R_{Ret}(x, y, \lambda_0) + T^{(1)}_{NA}(\lambda_0)\frac{d}{d\lambda}R_{Ret}(x, y, \lambda_0)\Sigma^{(1)} +$ "

and insert -- $\bigg(\frac{d}{d\lambda}T^{(1)}_{NA}(\lambda_0)R_{Ret}(x, y, \lambda_0) + T^{(1)}_{NA}(\lambda_0)\frac{d}{d\lambda}R_{Ret}(x, y, \lambda_0)\bigg)\Sigma^{(1)} +$ --

Lines 44-46, delete "$R_{Ret}(x, y, \lambda_0)\Sigma^{(0)}\bigg(\frac{d}{d\lambda}R_{Ret}(x, y, \lambda_0)\Sigma^{(1)} + \frac{1}{2}\frac{d^2}{d\lambda^2}R_{Ret}(x, y, \lambda_0)\Sigma^{(2)}$" and insert -- $R_{Ret}(x, y, \lambda_0)\Sigma^{(0)} + \frac{d}{d\lambda}R_{Ret}(x, y, \lambda_0)\Sigma^{(1)} + \frac{1}{2}\frac{d^2}{d\lambda^2}R_{Ret}(x, y, \lambda_0)\Sigma^{(2)}$ --

Line 51, delete "$X_y$-coordinate." and insert -- $X_P$-coordinate. --

Column 17
Line 15, delete "½" and insert -- 1/2 --

Column 18
Line 46, after "strength" insert -- . --
Line 53, delete "133" and insert -- $13_3$ --

In the Claims

Column 20
Line 30, in Claim 3, delete "claim 1" and insert -- claim 2 --
Line 36, in Claim 4, delete "claim 2," and insert -- claim 1, --

Column 21
Line 19, in Claim 19, delete "RRET" and insert -- $R_{RET}$ --

Column 22
Line 11 (Approx.), in Claim 19, delete "RRET" and insert -- $R_{RET}$ --
Line 13 (Approx.), in Claim 19, delete "RRET" and insert -- $R_{RET}$ --